United States Patent
Ambrose et al.

(10) Patent No.: US 6,803,273 B1
(45) Date of Patent: Oct. 12, 2004

(54) METHOD TO SALICIDE SOURCE-LINE IN FLASH MEMORY WITH STI

(75) Inventors: Thomas M. Ambrose, Richardson; Freidoon Mehrad, Plano; Ming Yang, Richardson; Lancy Tsung, Plano, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/574,730

(22) Filed: May 18, 2000

Related U.S. Application Data

(60) Provisional application No. 60/068,543, filed on Dec. 23, 1997, and provisional application No. 60/117,774, filed on Jan. 29, 1999.

(51) Int. Cl.⁷ ............................................ H01L 21/336
(52) U.S. Cl. ...................... 438/257; 438/256; 438/262; 438/149; 438/316; 438/386; 438/296
(58) Field of Search ............................. 438/257, 149, 438/256, 384, 30, 386, 296, 597, 682, 262

(56) References Cited

U.S. PATENT DOCUMENTS

| 5,087,584 A | * | 2/1992 | Wada et al. | |
|---|---|---|---|---|
| 5,278,438 A | * | 1/1994 | Kim et al. | 257/316 |
| 5,610,419 A | * | 3/1997 | Tanaka | 257/315 |
| 5,894,162 A | * | 4/1999 | Paterson et al. | 257/316 |

FOREIGN PATENT DOCUMENTS

| EP | 504987 A2 | * | 9/1992 | H01L/21/74 |
|---|---|---|---|---|
| JP | 40391245 A | * | 4/1989 | H01L/21/336 |

* cited by examiner

Primary Examiner—Matthew Smith
Assistant Examiner—V. Yevsikov
(74) Attorney, Agent, or Firm—Peter K. McLarty; W. James Brady, III; Frederick J. Telecky, Jr.

(57) ABSTRACT

A method of forming a semiconductor component having a conductive line (24) and a silicide region (140) that crosses a trench (72). The method involves forming nitride sidewalls (130) to protect the stack during the silicidation process.

14 Claims, 4 Drawing Sheets

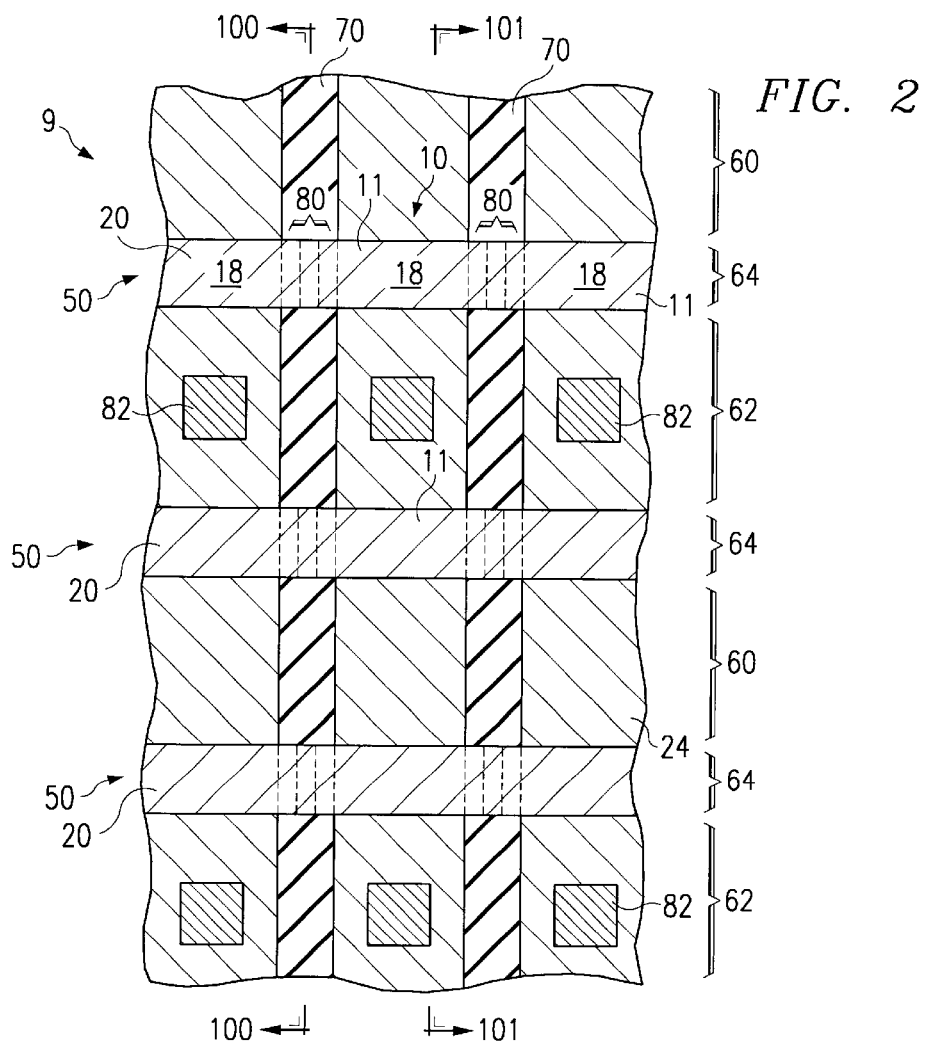
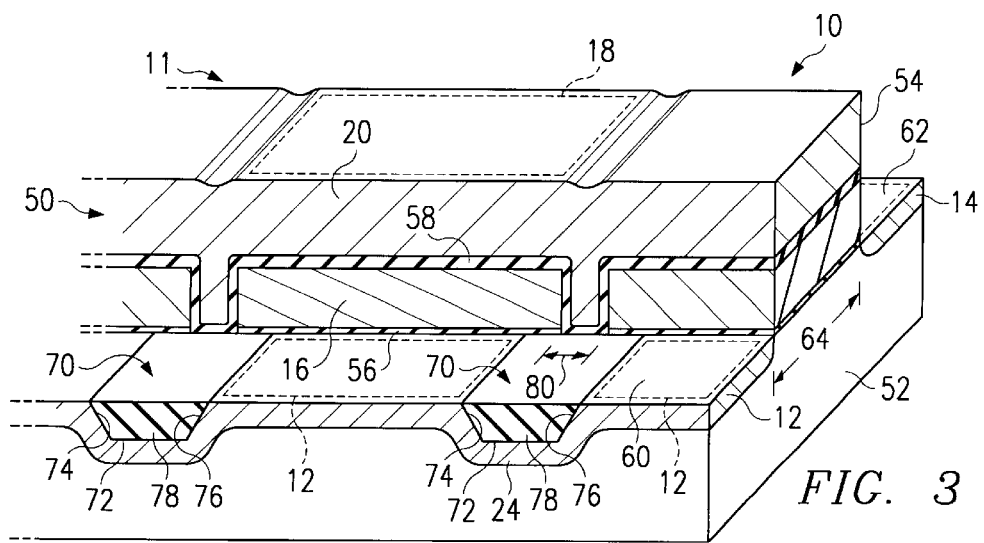

METHOD TO SALICIDE SOURCE-LINE IN FLASH MEMORY WITH STI

CROSS-REFERENCE TO RELATED PATENT/PATENT APPLICATIONS

The following commonly assigned patent/patent applications are hereby incorporated herein by reference:

| Patent No./Serial No. | Filing Date | TI Case No. |
| --- | --- | --- |
| 60/068,543 | 12/23/97 | TI-23167 |
| 60/117,774 | 1/29/99 | TI-28594P |

FIELD OF THE INVENTION

This invention relates generally to the field of electronic devices and more particularly to a method of fabricating a salicide source line in flash memory having shallow trench isolation (STI) structures.

BACKGROUND OF THE INVENTION

Electronic equipment such as televisions, telephones, radios, and computers are often constructed using semiconductor components, such as integrated circuits, memory chips, and the like. The semiconductor components are typically constructed from various microelectronic devices fabricated on a semiconductor substrate, such as transistors, capacitors, diodes, resistors, and the like. Each microelectronic device is typically a pattern of conductor, semiconductor, and insulator regions formed on the semiconductor substrate.

The density of the microelectronic devices on the semiconductor substrate may be increased by decreasing spacing between each of the various semiconductor devices. The decrease in spacing allows a larger number of such microelectronic devices to be formed on the semiconductor substrate. As a result, the computing power and speed of the semiconductor component may be greatly improved.

FLASH memory, also known as FLASH EPROM or FLASH EEPROM, is a semiconductor component that is formed from an array of memory cells with each cell having a floating gate transistor. Data can be written to each cell within the array, but the data is erased in blocks of cells. Each cell is a floating gate transistor having a source, drain, floating gate, and a control gate. The floating gate uses channel hot electrons for writing from the drain and uses Fowler-Nordheim tunneling for erasure from the source. The sources of each floating gate in each cell in a row of the array are connected to form a source line.

The floating gate transistors are electrically isolated from one another by an isolation structure. One type of isolation structure used is a LOCal Oxidation of Silicon (LOCOS) structure. LOCOS structures are generally formed by thermally growing a localized oxidation layer between the cells to electrically isolate the cells. One problem with the LOCOS structure is that the structure includes non-functional areas that waste valuable space on the semiconductor substrate.

Another type of isolation structure used is a Shallow Trench Isolation (STI). STI structures are generally formed by etching a trench between the cells and filling the trench with a suitable dielectric material. STI structures are smaller than LOCOS structures and allow the cells to be spaced closer together to increase the density of cells in the array. However, STI structures are often not used in FLASH memory due to the difficulty in forming the source line that connects the cells in each row. The source line in FLASH memory utilizing STI structures often has a higher resistance than a corresponding FLASH memory that uses LOCOS structures. The increased electrical resistance reduces the operational performance of the memory.

SUMMARY OF THE INVENTION

Accordingly, a need has arisen for a low resistance source line for flash memory using an STI structure and method of construction. The present invention provides a method for forming a salicide source line for flash memory using a STI structure and method of construction. The salicide source line forms a low resistivity path that substantially eliminates or reduces problems associated with the prior methods and systems.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which:

FIG. 2 is an enlarged plan view of a portion of the memory cell of FIG. 1 array in accordance with the present invention;

FIG. 3 is a perspective view of a portion of the memory cell array of FIG. 2 in accordance with the present invention;

DETAILED DESCRIPTION OF THE INVENTION

FIGS. 1 through 5 illustrate various aspects of an electronic device and the fabrication of a source line used within the electronic device. As described in greater detail below, the method of the instant invention can be used to fabricate a source line having a reduced electrical resistance.

Figure 1:
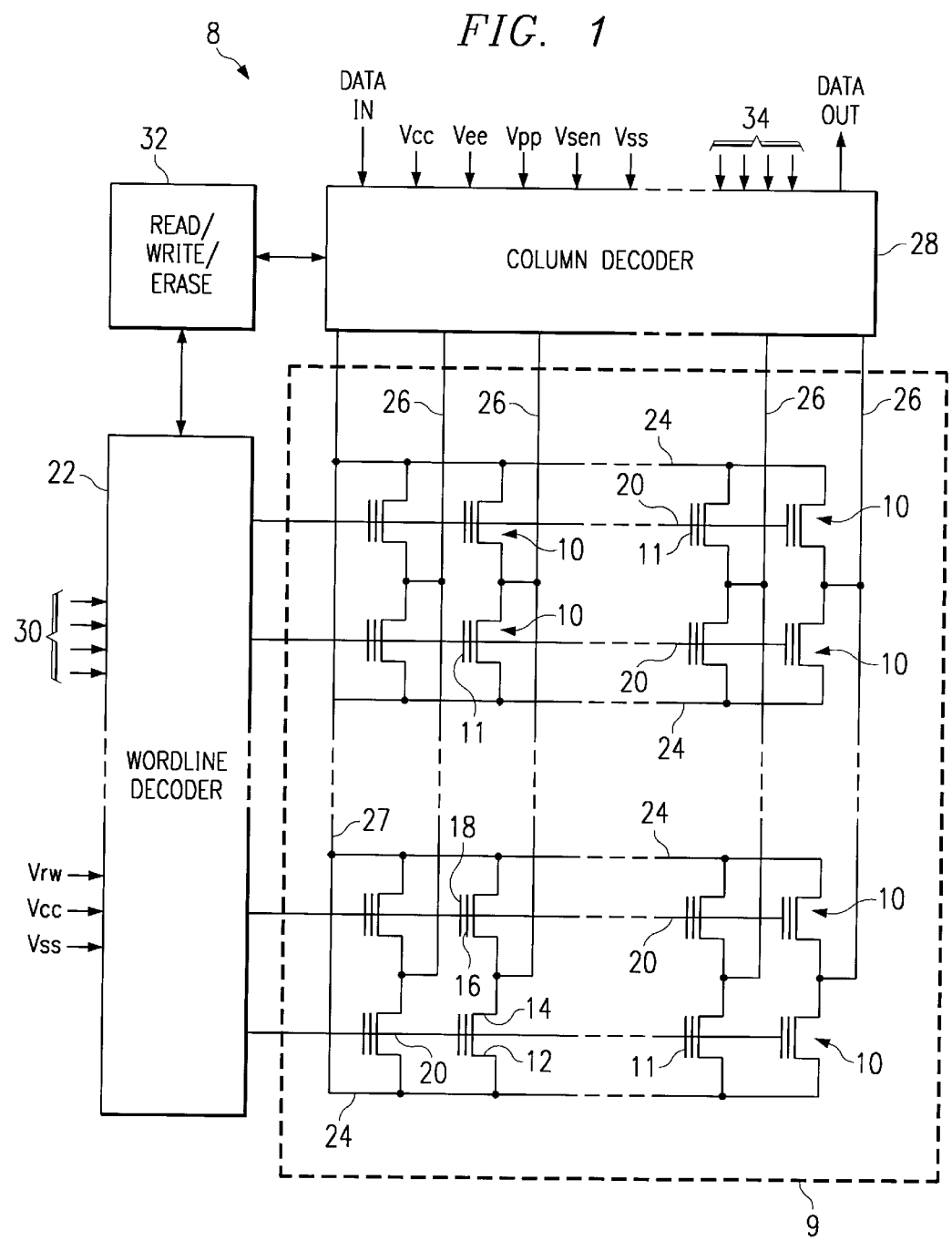
FIG. 1 is an electrical schematic diagram, in partial block diagram form, of an electronic device which includes a memory cell array in accordance with the present invention.

FIG. 1 is an electrical schematic diagram, in partial block form, of an electronic device 8 into which the invention may be incorporated. The electronic device 8 includes a wordline decoder 22, a column decoder 28, a Read/Write/Erase control circuit 32 for controlling the decoders 22 and 28, and a memory cell array 9. The memory cell array 9 comprises a number of memory cells 10 arranged in rows and columns. Each memory cell 10 includes a floating-gate transistor 11 having a source 12, a drain 14, a floating gate 16, and a control gate 18.

Each of the control gates 18 in a row of cells 10 is coupled to a wordline 20, and each of the wordlines 20 is coupled to the wordline decoder 22. Each of the sources 12 in a row of cells 10 is coupled to a source line 24. Each of the drains 14 in a column of cells 10 is coupled to a drain-column line 26. Each of the source lines 24 is coupled by a column line 27 to the column decoder 28 and each of the drain-column lines 26 is coupled to the column decoder 28.

In a write or program mode, the wordline decoder 22 may function, in response to wordline address signals on lines 30 and to signals from the Read/Write/Erase control circuit 32 to place a preselected first programming voltage $V_{RW}$, approximately +12V, on a selected wordline 20, which is coupled to the control gate 18 of a selected cell 10. Column decoder 28 also functions to place a second programming voltage $V_{PP}$, approximately +5 to +10V, on a selected drain-column line 26 and, therefore, the drain 14 of the selected cell 10. Source lines 24 are coupled to a reference potential $V_{SS}$ through line 27. All of the deselected drain-column lines 26 are coupled to the reference potential $V_{SS}$. These programming voltages create a high current (drain 14 to source 12) condition in the channel of the selected memory cell 10, resulting in the generation near the drain-channel junction of channel-hot electrons and avalanche breakdown electrons that are injected across the gate oxide to the floating gate 16 of the selected cell 10. The programming time is selected to be sufficiently long to program the floating gate 16 with a negative program charge of approximately −2V to −6V with respect to the gate region. For memory cells 10 fabricated in accordance with one embodiment of the present invention, the coupling coefficient between the control gate 18, the wordline 20, and the floating gate 16 is approximately 0.5. Therefore, a programming voltage $V_{RW}$ of 12 volts, for example, on a selected wordline 20, which includes the selected gate control 18, places a voltage of approximately +5 to +6 V on the selected floating gate 16.

The floating gate 16 of the selected cell 10 is charged with channel-hot electrons during programming, and the electrons in turn render the source-drain path under the floating gate 16 of the selected cell 10 nonconductive, a state which is read as a "zero" bit. Deselected cells 10 have source-drain paths under the floating gate 16 that remain conductive, and those cells 10 are read as "one" bits.

In a flash erase mode, the column decoder 28 functions to leave all drain-column lines 26 floating. The wordline decoder 22 functions to connect all of the word lines 20 to the reference potential $V_{SS}$. The column decoder 28 also functions to apply a high positive voltage $V_{EE}$, approximately +10V to +15V, to all of the source lines 24. These erasing voltages create sufficient field strength across the tunneling area between floating gate 16 and the semiconductor substrate to generate a Fowler-Nordheim tunnel current that transfers charge from the floating gate 16, thereby erasing the memory cell 10.

In the read mode, the wordline decoder 22 functions, in response to wordline address signals on lines 30 and to signals from Read/Write/Erase control circuit 32, to apply a preselected positive voltage $V_{CC}$, approximately +5V, to the selected wordline 20, and to apply a low voltage, ground or $V_{SS}$, to deselected wordlines 20. The column decoder 28 functions to apply a preselected positive voltage $V_{SEN}$, approximately +1.0V, to at least the selected drain column line 28 and to apply a low voltage to the source line 24. The column decoder 28 also functions, in response to a signal on an address line 34, to connect the selected drain-column line 26 of the selected cell 10 to the DATA OUT terminal. The conductive or non-conductive state of the cell 10 coupled to the selected drain-column line 26 and the selected wordline 20 is detected by a sense amplifier (not shown) coupled to the DATA OUT terminal. The read voltages applied to the memory array 9 are sufficient to determine channel impedance for a selected cell 10 but are insufficient to create either hot-carrier injection or Fowler-Nordheim tunneling that would disturb the charge condition of any floating gate 16.

For convenience, a table of read, write and erase voltages is given in TABLE 1 below:

TABLE 1

|  | Read | Write | Flash Erase |
| --- | --- | --- | --- |
| Selected Wordline | 5 V | 12 V | 0 V (All) |
| Deselected Word lines | 0 V | 0 V | — |
| Selected Drain Line | 1.0 V | 5–10 V | Float (All) |
| Deselected Drain Lines | Float | 0 V | — |
| Source lines | 0 V | About 0 V | 10–15 V (All) |

FIGS. 2 and 3 illustrate the structure of a portion of the memory array 9 illustrated in FIG. 1. Specifically, FIG. 2 is an enlarged plan view of a portion of a memory array 9, and FIG. 3 is a perspective view of a portion of the memory array 9 illustrated in FIG. 2. As discussed previously, the memory array 9 includes a number of memory cells 10 arranged in rows and columns.

As best illustrated in FIG. 3, each row of memory cells 10 is formed from a continuous stack structure 50 that includes a number of memory cells 10. The floating gate transistor 11 within each memory cell 10 is formed on a semiconductor substrate 52 and separated from each adjacent memory cell 10 in the continuous stack structure 50 by a shallow trench isolation structure 70. The semiconductor substrate 52 includes a source region 60 and a drain region 62 separated by a channel region 64. The floating gate transistor 11 is generally fabricated by forming a gate stack 54 outwardly from a portion of the channel region 64 and doping a portion of the source region 60 and a portion of the drain region 62 adjacent the gate stack 54 to form a source 12 and a drain 14, respectively.

The semiconductor substrate 52 may comprise a wafer formed from a single-crystalline silicon material. However, it will be understood that the semiconductor substrate 52 may comprise other suitable materials or layers without departing from the scope of the present invention. For example, the semiconductor substrate 52 may include an epitaxial layer, a recrystallized semiconductor material, a polycrystalline semiconductor material, or any other suitable semiconductor material.

The regions 60, 62, and 64 are substantially parallel and may extend the length of the memory array 9. The channel region 64 of the semiconductor substrate 52 is doped with impurities to form a semiconductive region. The channel region 64 of the semiconductor substrate 12 may be doped with p-type or n-type impurities to change the operating characteristics of a microelectronic device (not shown) formed on the doped semiconductor substrate 52.

As best illustrated in FIG. 3, the floating gate transistors 11 in each continuous stack structure 50 in the memory array 9 are electrically isolated from one another by the shallow trench isolation (STI) structure 70. The STI structures 70 are generally formed prior to the fabrication of the gate stack 54 on the semiconductor substrate 52. The STI structures 70 are formed by etching a trench 72 into the semiconductor substrate 52. The trench 72 is generally on the order of 0.3 to 8.5 µm in depth. The trench 72 comprises a first sidewall surface 74 and a second sidewall surface 76. As discussed in greater detail below, the sidewall surfaces 74 and 76 may be fabricated at an angle to vary the cross-sectional shape of the trench 72.

The trench 72 is then filled with a trench dielectric material 78 to electrically isolate the active regions of the semiconductor substrate 52 between the STI structures 70. The trench dielectric material 78 may comprise silicon dioxide, silicon nitride, or a combination thereof. The trench dielectric material 78 is generally etched back, followed by a deglaze process to clean the surface of the semiconductor substrate 52 prior to fabrication of the gate stack 54. It will be understood that the trench dielectric material 78 may comprise other suitable dielectric materials without departing from the scope of the present invention.

The continuous stack structure 50 is then fabricated outwardly from the semiconductor substrate 52 and the filled trench 72. The continuous stack structure 50 is formed from a series of gate stacks 54 fabricated outwardly from the channel region 64 of the semiconductor substrate 52. As best shown in FIG. 3, the gate stack 54 comprises a gate insulator 56, the floating gate 16, an interstitial dielectric 58, and the control gate 18. The gate insulator 56 is formed outwardly from the semiconductor substrate 52, and the floating gate 16 is formed outwardly from the gate insulator 56. The interstitial dielectric 58 is formed between the floating gate 16 and the control gate 18 and operates to electrically isolate the floating gate 16 from the control gate 18.

The gate insulator 56 is generally grown on the surface of the semiconductor substrate 52. The gate insulator 56 may comprise oxide or nitride on the order of 100 to 500 A in thickness. It will be understood that the gate insulator 56 may comprise other materials suitable for insulating semiconductor elements.

The floating gate 16 and the control gate 18 are conductive regions. The gates 16 and 18 generally comprise a polycrystalline silicon material (polysilicon) that is in-situ doped with impurities to render the polysilicon conductive. The thickness' of the gates 16 and 18 are generally on the order of 100 nanometers and 300 nanometers, respectively. It will be understood that the gates 16 and 18 may comprise other suitable conductive materials without departing from the scope of the present invention.

The interstitial dielectric 58 may comprise oxide, nitride, or a heterostructure formed by alternating layers of oxide and nitride. The interstitial dielectric 58 is on the order of 20 to 40 nanometers in thickness. It will be understood that the interstitial dielectric 58 may comprise other materials suitable for insulating semiconductor elements.

As best illustrated in FIG. 2, the control gate 18 of each floating gate transistor 11 is electrically coupled to the control gates 18 of adjacent floating gate transistors 11 within adjacent continuous stack structures 50 to form a continuous conductive path. In the context of the memory array 9 discussed with reference to FIG. 1, the continuous line of control gates 18 operate as the wordline 20 of the memory array 9.

In contrast, the floating gate 16 of each floating gate transistor 11 is not electrically coupled to the floating gate 16 of any other floating gate transistor 11. Thus, the floating gate 16 in each floating gate transistor 11 is electrically isolated from all other floating gates 16. In one embodiment, the floating gates 16 in adjacent memory cells 10 are isolated by a gap 80. The gap 80 is generally etched into a layer of conductive material (not shown) that is used to form the floating gate 16.

The source 12 and the drain 14 of the floating gate transistor 11 are formed within a portion of the source region 60 and the drain region 62 of the semiconductor substrate 52, respectively. The source 12 and the drain 14 comprise portions of the semiconductor substrate 52 into which impurities have been introduced to form a conductive region. The drains 14 of each floating gate transistor 11 in a column are electrically coupled to each other by a number of drain contacts 82 to form the drain column line 26 (not shown). The drain column line 26 is generally formed outwardly from the wordline 20. As will be discussed in greater detail below, the source 12 of each floating gate transistor 11 forms a portion of the source line 24 and is formed during the fabrication of the source line 24.

As best illustrated in FIG. 3, a portion of the source line 24 forms the source 12 of the floating gate transistor 11. The source line 24 connects the sources 12 to each other by a continuous conductive region formed within the semiconductor substrate 52 proximate the source region 60. As best illustrated in FIG. 3, the source line 24 crosses the STI structures 70 in the source region 60 of the semiconductor substrate 52 below the STI structures 70. In contrast, the STI structures 70 electrically isolate the adjacent floating gate transistors 11 in the channel region 64 of the semiconductor substrate.

The source line 24, and correspondingly the sources 12 of each floating gate transistor 11, is generally fabricated after at least a portion of the gate stack 54 has been fabricated. The gate stack 54 is pattern masked (not shown) using conventional photolithography techniques, leaving the semiconductor substrate 52, proximate the source region 60, exposed. The exposed region of the semiconductor substrate 52 is then etched to remove the trench dielectric material 78 in the exposed region. The etching process to remove the trench dielectric material 78 may be an anisotropic etching process. Anisotropic etching may be performed using a reactive ion etch (RIE) process using carbon-fluorine based gases such as $CF_4$ or $CHF_3$.

The semiconductor substrate 52 proximate the source region 60, including that portion of the semiconductor substrate 52 forming the trench 72, is doped with impurities to render the region conductive. The conductive region is then thermally treated to diffuse the impurities into the source region 60 of the semiconductor substrate 52. The diffused conductive region forms both the source 12 of each floating gate transistor 11 as well as the source line 24. The source region 60 of the semiconductor substrate 52 is generally doped by an implantation process in which dopant ions are impacted into the semiconductor substrate 52.

Figure 4A:
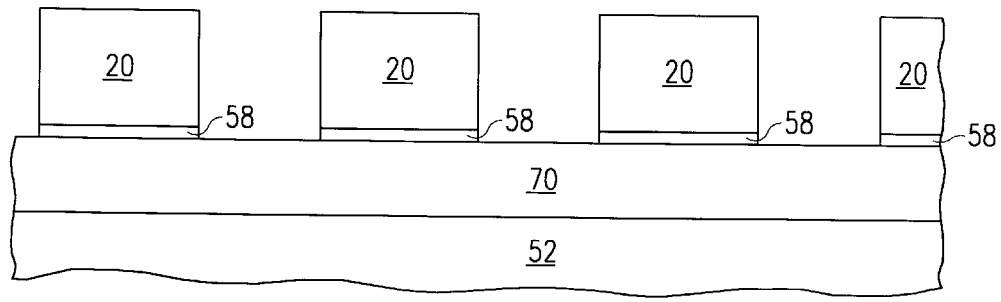
FIGS. 4A–4E are cross sections of a semiconductor substrate illustrating the fabrication of forming a silicided source line in accordance with one embodiment of the present invention.

FIGS. 4A–4E are cross sections of the semiconductor substrate 52 according to the invention in the plane shown by line 100 in FIG. 2. These figures will illustrate the fabrication of a silicided source line 24 with reduced resistance. The other features of the integrated circuit that exist on the substrate (as discussed above) have been omitted from the figure for clarity. FIG. 4A is a cross-section of the semiconductor substrate taken in the 100 plane in FIG. 2 showing the trench oxide 70, the substrate 52, the polysilicon word line 20, and the interstitial dielectric 58. This structure is formed after stack etch and dopant impurity implantation and annealing to form the source region 60 and drain region 62 of the cell.

Figure 4B:
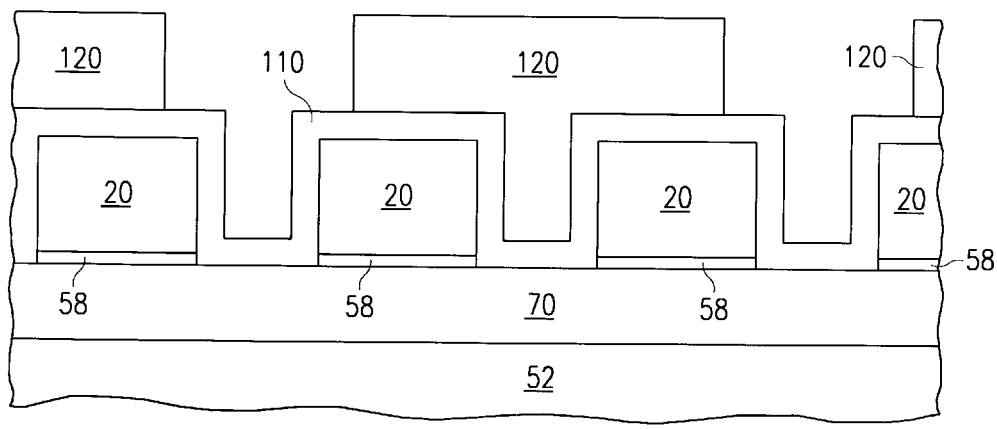

As shown in FIG. 4B, in an embodiment of the instant invention, a thin film of nitride 110 about 50 A to 600 A thick is formed on the structure of FIG. 4A. In one embodiment of the instant invention this nitride film deposition process may be performed using the following range of processing conditions on standard semiconductor processing deposition equipment:

| | |
|---|---|
| Dichlorosilane | 60–100 sccm |
| NH3 | 700–900 sccm |
| Pressure | 150–300 torr |
| Temperature | 700–850 C. |
| Deposition Time | 10–20 minutes |

Following the deposition of the thin nitride film 110, a layer of photoresist 120 is formed and patterned using standard photolithographic techniques. This pattern exposes the area in the trench oxide 70 that will be removed during the trench etch process.

Figure 4C:
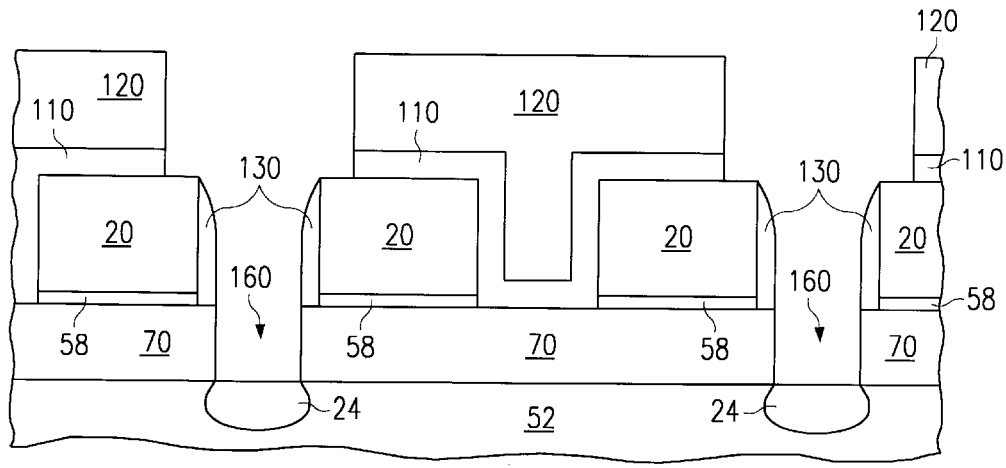

Shown in FIG. 4C is the structure formed following the trench etch and source line implantation processes applied to the structure shown in FIG. 4B. The trench etch process is a two step process that first etches the thin nitride film 110 and then etches the trench oxide 70. In one embodiment of the instant invention this two step etch process may be performed using the following range of processing conditions on standard semiconductor processing plasma etch equipment:

| Step 1 (Nitride etch) | |
|---|---|
| Argon | 150–180 sccm |
| CHF3 | 8–15 sccm |
| Pressure | 18–30 mTorr |
| RF | 500 Watt |
| Cathode Temp | 20 C. |
| Etch Time | 5–20 seconds |

| Step 2 (Oxide etch) | |
|---|---|
| Argon | 200–400 sccm |
| CO | 150–300 sccm |
| C4F8 | 5–15 sccm |
| Pressure | 30 mTorr |
| RF | 1000–2000 Watt |
| Cathode | 20 C. |
| Etch Time | 20–80 seconds |

The above two step etch may be performed in a standard plasma etch chamber. This process results in the formation of the nitride sidewalls 130 and the oxide trench 160 shown in FIG. 4C. Following the formation of the oxide trench 160, a blanket implantation of a dopant species is performed forming the source line structure 24. In one embodiment this dopant species is arsenic, phosphorous, antimony either singly or in combination. Following the blanket implant, the patterned resist film 120 is removed using standard processing. In one embodiment of the instant invention, a metal (preferably comprising of Ti, but it can also be comprised of tungsten, molybdenum, cobalt, nickel, platinum, or palladium) is formed on the structure. Silicide regions are formed by reacting the metal with any underlying silicon regions by performing a silicide formation step at a temperature of around 500 to 800 C. Any unreacted metal is then etched using standard processes. This process results in the formation of the source line silicide region 140 shown in FIG. 4D. This source line silicided region will have a much reduced resistance when compared with the diffused source line process.

Figure 4D:
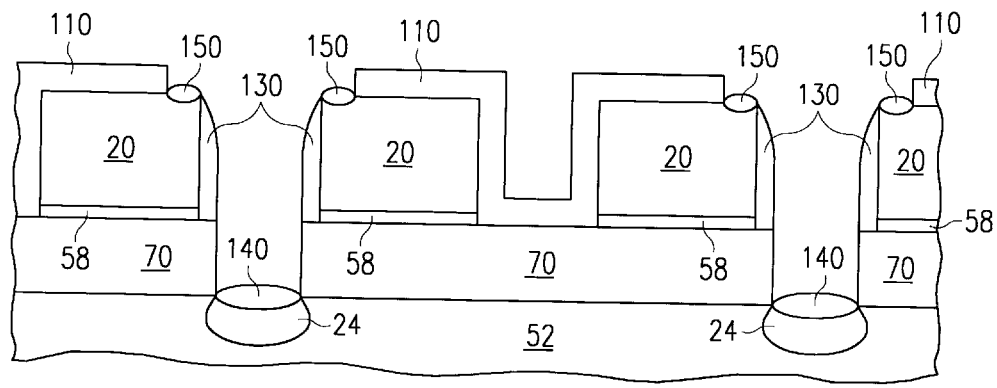

Also shown in FIG. 4D, are small silicide regions 150 that form in the word line 20. These small areas are a result of tolerances in the photolithographic processes and will not have any effect on the device performance. For an improved zero tolerance photolithographic process these silicide regions 150 in the word line 20 will not be present. Following the unreacted metal etch process, an optional second anneal step can be performed at a temperature of around 600–1000 C. In another embodiment of the instant invention an implant anneal step is performed subsequent to the photoresist removal step and prior to the silicide formation process. This implant anneal can be performed at a temperature of around 500–1100 C. using a furnace process, a rapid thermal process, or a combination of both.

Figure 4E:
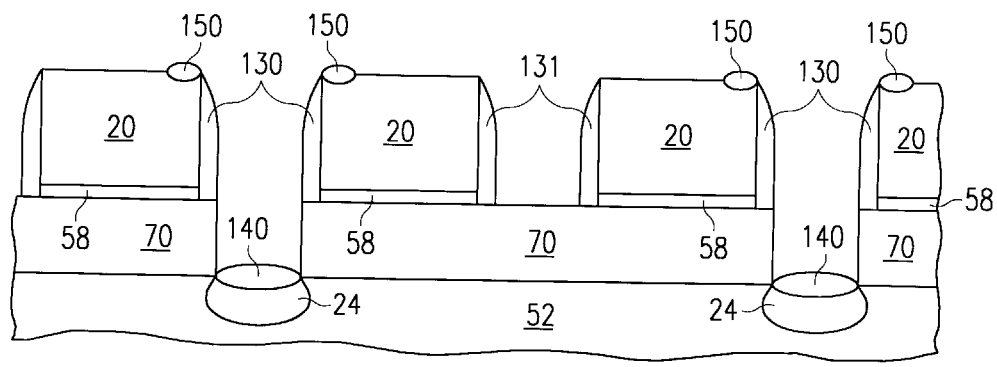

Following the silicide formation, a blanket nitride etch is performed resulting in the structure shown in FIG. 4E. This blanket etch results in the additional nitride sidewalls 131 shown in the Figure. A necessary requirement of the blanket nitride etch is a high nitride to silicide selectivity. In one embodiment of the instant invention where cobalt silicide was formed, the blanket nitride etch may be performed using the following range of processing conditions on standard semiconductor processing plasma etch equipment:

| | |
|---|---|
| Argon | 150–270 sccm |
| CHF3 | 15–50 sccm |
| O2 | 1–8 sccm |
| RF | 200–600 Watt |
| Pressure | 300–500 mTorr |
| Gap | 1.15 cm |
| Etch Time | 10–60 seconds |

Figure 5:
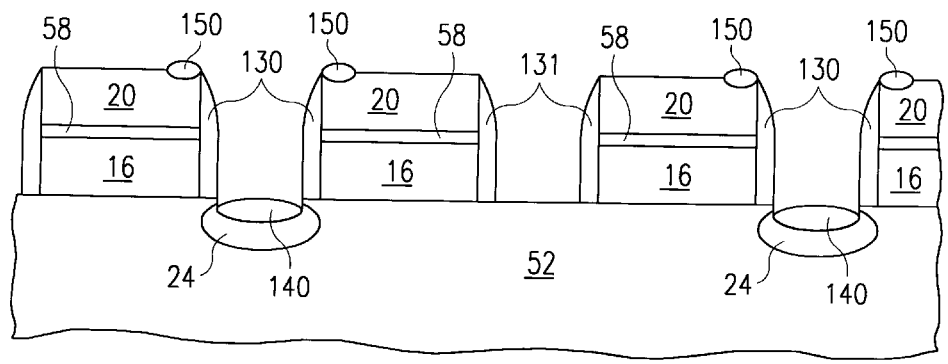
FIG. 5 is a cross-section of a semiconductor substrate illustrating a silicided source line in accordance with an embodiment of the instant invention.

Shown in FIG. 5 is a cross of the substrate taken in the plane of line 110 in FIG. 2 showing a silicide region 24 and the source line 24 fabricated according to the method of the instant invention. Furthermore, FIG. 5 shows the nitride sidewall positioned on an exposed top surface of the substrate adjacent the source.

Although the present invention has been described with several embodiments, various changes and modifications may be suggested to one skilled in the art. It is intended that the present invention encompass such changes and modifications that follow within the scope of the appended claims.

We claim:

1. A method of forming an electronic device having a conducting line, said method comprising:

a) providing a semiconductor substrate with a plurality of semiconductor devices and at least one isolation structure, said plurality of semiconductor devices each having a gate and a source;

b) forming a nitride film over said isolation structure;

c) etching a portion of said nitride film and a portion of said isolation structure thereby exposing a region of said semiconductor substrate beneath said isolation structure and forming a nitride sidewall film on an exposed side surface of said source; and d) forming a silicide on said region of said semiconductor substrate beneath said isolation structure.

2. The method of claim 1, wherein said isolation structure is shallow trench isolation or LOCOS.

3. The method of claim 1, wherein said plurality of semiconductor devices comprises FLASH memory cells.

4. The method of claim 1, wherein said silicide is formed with a metal from the group consisting of titanium, tungsten, molybdenum, cobalt, nickel, platinum, and palladium.

5. A method of forming an integrated circuit memory, said method comprising:

a) providing a semiconductor substrate with a plurality of FLASH memory cells, each FLASH memory cell having a gate structure with a top surface and a side surface adjacent a source, said FLASH memory cells being adjacent to a plurality of isolation structures;

b) forming a nitride film on said isolation structures;

c) etching said nitride film forming a nitride sidewall film on said side surface adjacent a source on a plurality of FLASH memory cells;

d) etching said isolation structures to form a source line by exposing a plurality of regions of said semiconductor substrate beneath said isolation structures;

e) implanting said source line with a dopant species; and f) forming a silicide on said source line.

6. The method of claim 5, wherein said isolation structures are formed using shallow trench isolation or LOCOS.

7. The method of claim 5, wherein said silicide is formed with a metal from the group consisting of titanium, tungsten, molybdenum, cobalt, nickel, platinum, and palladium.

8. A method of forming a conductive line, comprising the steps of:

a) forming an isolation structure in a semiconductor body;

b) etching a trench through said isolation structure to expose a semiconductor region of said semiconductor body below said isolation structure;

c) forming a sidewall film on at least one sidewall of said trench; and d) forming a silicide on said exposed semiconductor region to form said conductive line.

9. The method of claim 8 wherein said isolation structure is LOCOS.

10. The method of claim 8 wherein said isolation structure is STI.

11. The method of claim 8 wherein said semiconductor body further comprises at least one semiconductor device.

12. The method of claim 11 wherein said semiconductor device is a FLASH memory device.

13. The method of claim 8 wherein said sidewall film is a film from the group consisting of silicon nitride, silicon oxynitride, and a polymer.

14. The method of claim 8 wherein said silicide is formed with a metal from the group consisting of titanium, tungsten, molybdenum, cobalt, nickel, platinum, and palladium.

\* \* \* \* \*